(12) United States Patent
Erhardt

(10) Patent No.: US 7,830,095 B2
(45) Date of Patent: Nov. 9, 2010

(54) LED ASSEMBLY AND MODULE

(75) Inventor: Robert A. Erhardt, Schaumburg, IL (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 283 days.

(21) Appl. No.: 11/916,128

(22) PCT Filed: Jun. 1, 2006

(86) PCT No.: PCT/IB2006/051765

§ 371 (c)(1),
(2), (4) Date: Nov. 30, 2007

(87) PCT Pub. No.: WO2006/129291

PCT Pub. Date: Dec. 7, 2006

(65) Prior Publication Data

US 2008/0218095 A1  Sep. 11, 2008

Related U.S. Application Data

(60) Provisional application No. 60/686,812, filed on Jun. 2, 2005.

(51) Int. Cl.
H05B 39/04 (2006.01)
(52) U.S. Cl. ............ 315/224; 315/209 R; 315/307
(58) Field of Classification Search .......... 315/209 R, 315/210, 211, 215–217, 224–226, 284, 285 R, 315/186–188, 192, 193, 185 S, 291, 294, 315/295, 297, 299–302, 307–313, 320, 322, 315/323, 362, 32, 71, 72, 74; 362/800, 802, 362/227, 249, 251; 313/238, 281, 282, 483, 313/498; 257/79, 80, 83, 88, 89
See application file for complete search history.

(56) References Cited

U.S. PATENT DOCUMENTS

| | | | |
|---|---|---|---|
| 5,463,280 A | 10/1995 | Johnson | |
| 5,569,939 A | 10/1996 | Choi | |
| 6,078,148 A * | 6/2000 | Hochstein | 315/291 |
| 6,583,791 B2 | 6/2003 | Berryman et al. | |
| 6,853,150 B2 | 2/2005 | Clauberg et al. | |
| 7,296,913 B2 * | 11/2007 | Catalano et al. | 362/257 |
| 2004/0201988 A1 * | 10/2004 | Allen | 362/249 |
| 2004/0263094 A1 | 12/2004 | Lister | |
| 2005/0029535 A1 | 2/2005 | Mazzochette | |
| 2005/0047031 A1 * | 3/2005 | Naito | 361/18 |

FOREIGN PATENT DOCUMENTS

| | | |
|---|---|---|
| CA | 2171244 | 9/1996 |
| CA | 2171244 A1 | 9/1996 |
| DE | 4129059 | 3/1993 |
| DE | 4129059 A1 | 3/1993 |
| DE | 10013207 A1 | 9/2001 |
| EP | 942474 A2 | 9/1999 |
| EP | 0942474 B1 | 9/1999 |
| FR | 2568042 | 1/1986 |
| FR | 2568042 A1 | 1/1986 |
| JP | 07273371 | 10/1995 |

(Continued)

*Primary Examiner*—Douglas W Owens
*Assistant Examiner*—Jianzi Chen

(57) ABSTRACT

A light emitting diode (LED) assembly and module including a substrate (48) having opposing first and second sides (50, 52); a capacitor (32) having first and second electrically-conductive plates (44, 46) respectively disposed proximate the first and second sides (50, 52) of the substrate (48); and an anti-parallel LED structure (34) electrically connected to the first electrically-conductive plate (44) and thermally coupled to the substrate (48).

25 Claims, 8 Drawing Sheets

FOREIGN PATENT DOCUMENTS

| | | |
|---|---|---|
| JP | 07273371 A | 10/1995 |
| JP | 8137429 | 5/1996 |
| JP | 08137429 A | 5/1996 |
| JP | 2003139712 | 5/2003 |
| WO | 0235889 A1 | 5/2002 |
| WO | 03056878 A1 | 7/2003 |

* cited by examiner ary having a plurality of impedance circuits connected in parallel, with each of the plurality of impedance circuits comprising a resistor serially connected to a switch; a controller operably connected to the switchable impedance array to actuate the switches in the plurality of impedance circuits, the controller being responsive to the temperature signal; and a temperature sensor thermally connected to the LED array to generate the temperature signal.

LED ASSEMBLY AND MODULE

CROSS REFERENCE TO RELATED APPLICATION

This application claims the benefit of U.S. provisional application Ser. No. 60/686,812, filed Jun. 2, 2005, the entire subject matter of which is hereby incorporated by reference.

This invention relates generally to light emitting diodes (LEDs), and more specifically to an LED assembly and module.

Light emitting diodes (LEDs) are being widely used in a variety of applications, such as traffic signals and signage. LEDs are expected to replace incandescent lamps in automotive applications in the near future and to replace incandescent, halogen, and fluorescent lamps in many general illumination applications within a few years. LEDs provide bright lighting with high efficiency.

LEDs present certain problems, however, due to operating characteristics and manufacturing limitations. LEDs exhibit large changes in current with small changes in voltage, so the LED drivers must control current to the LEDs. While one solution has been to limit current by placing a resistor in series with the LEDs, such a solution fails to optimize for functionality and efficiency requirements of particular LEDs in particular applications. The resistors increase the size and expense of LED assemblies. The resistors also generate heat, which must be removed with the heat from the LEDs themselves.

Large process variations in the manufacture of LEDs result in large variations in operating characteristics. To account for operating characteristic variations, manufacturers sample the operating characteristics and sort the LEDs into batches having similar operating characteristics, called bins. Examples of bins are voltage bins, which account for voltage differences; flux bins, which account for light output differences at a given drive current; and color bins, which account for color differences. LED drivers to compensate for operating characteristic variations are complex and expensive. When multiple color LEDs are used in an LED assembly, either a single driver with multiple outputs or multiple drivers are required: the first increases complexity and the second increases expense.

It would be desirable to provide an LED assembly and module that overcomes the above disadvantages.

One aspect of the invention provides a light emitting diode (LED) assembly including a substrate having opposing first and second sides, a capacitor having first and second electrically-conductive plates respectively disposed proximate the first and second sides of the substrate, and an anti-parallel LED structure electrically connected to the first electrically-conductive plate and thermally coupled to the substrate.

Another aspect of the invention provides adjustable output light emitting diode (LED) module including an LED driver, and at least one LED assembly electrically connected parallel to the LED driver, with the LED assembly having an LED array and a switchable impedance array. The LED array includes at least one anti-parallel LED structure, and the switchable impedance array includes a plurality of impedance circuits connected in parallel. Each of the plurality of impedance circuits includes a capacitor serially connected to a switch.

Another aspect of the invention provides an adjustable output light emitting diode (LED) module including an LED driver; at least one LED assembly electrically connected parallel to the LED driver, the LED assembly having an LED array and a switchable impedance array, the LED array having at least one LED structure, the switchable impedance array having a plurality of impedance circuits connected in parallel, with each of the plurality of impedance circuits comprising a resistor serially connected to a switch; a controller operably connected to the switchable impedance array to actuate the switches in the plurality of impedance circuits, the controller being responsive to the temperature signal; and a temperature sensor thermally connected to the LED array to generate the temperature signal.

Another aspect of the invention provides an adjustable output light emitting diode (LED) system including an anti-parallel LED structure, an impedance array electrically connected in series with the anti-parallel LED structure, means for providing an alternating current to the anti-parallel LED structure, and means for switching impedance of the impedance array.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof. Like elements share like reference numbers throughout the drawings.

Figure 1:
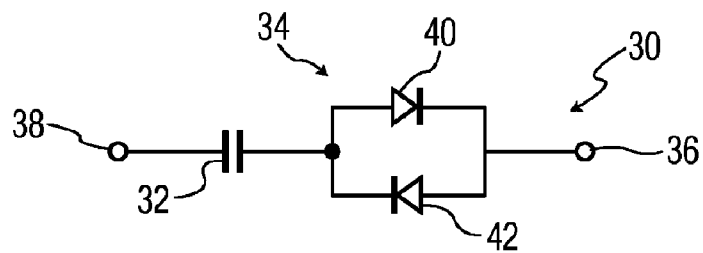
FIG. 1 is a schematic diagram of an LED assembly made in accordance with the present invention.

FIG. 1 is a schematic diagram of a light emitting diode (LED) assembly made in accordance with the present invention. The LED assembly 30 includes a capacitor 32 and an anti-parallel LED structure 34 connected in series between a first connection 36 and a second connection 38. The anti-parallel LED structure 34 includes a first LED 40 and a second LED 42 connected in an anti-parallel manner, i.e., the first LED 40 and the second LED 42 are connected with opposite polarizations. In one embodiment, the anti-parallel LED structure 34 and the capacitor 32 are matched to compensate for operating characteristics of the anti-parallel LED structure 34. The LED assembly 30 can be driven with an LED driver generating an alternating current as described in U.S. Pat. No. 6,853,150 incorporated herein by reference in its entirety. Those skilled in the art will appreciate that the anti-parallel LED structure 34 is not limited to a single pair of LEDs, but can include a number of LEDs connected in serial, parallel, and/or other array configurations as desired.

Figure 2A:
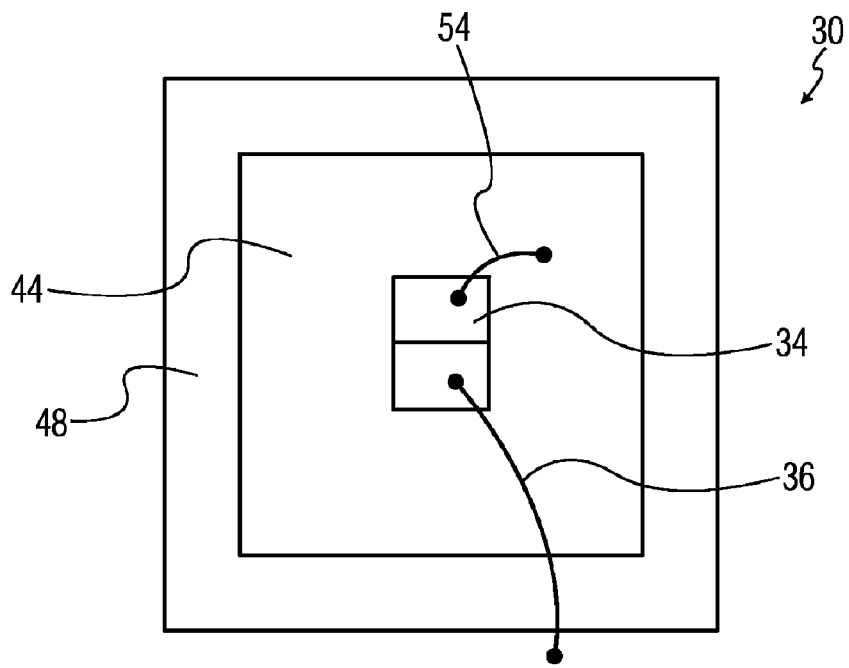
FIGS. 2A & 2B are directional views of an LED assembly made in accordance with the present invention.
Figure 2B:
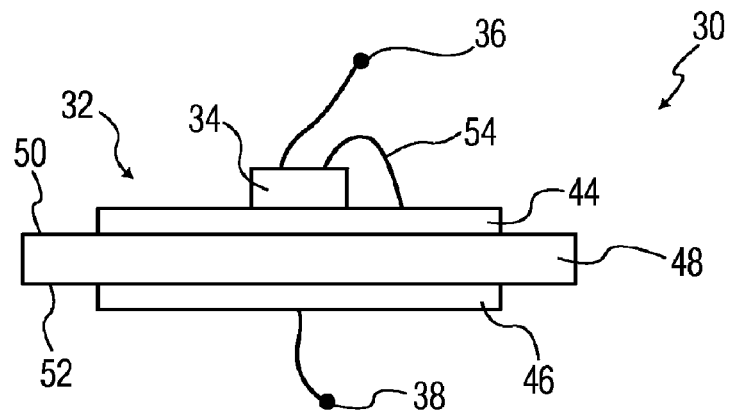

FIGS. 2A & 2B are top and side views, respectively, of an LED assembly made in accordance with the present invention. The capacitor 32 includes a first electrically-conductive plate 44 and second electrically-conductive plate 46. A substrate 48 having a first side 50 opposing a second side 52 is disposed between the first electrically-conductive plate 44 and the second electrically-conductive plate 46, with the first and second electrically-conductive plates respectively disposed proximate the first and second sides of the substrate 48. The first connection 36 and the second connection 38 can be used to connect to a printed circuit board or additional electrical components. The first connection 36 is electrically connected to the anti-parallel LED structure 34, which is electrically connected by connector 54 to the first electrically-conductive plate 44. The second connection 38 is electrically connected to the second electrically-conductive plate 46. The anti-parallel LED structure 34 is thermally coupled to the substrate 48. In one embodiment, the anti-parallel LED structure 34 is mounted on the first electrically-conductive plate 44. In another embodiment, the anti-parallel LED structure 34 is mounted on the substrate 48.

The substrate 48 can be made of any suitable dielectric providing the desired capacitance for the capacitor 32, such as the dielectric used in multilayer ceramic capacitors. In one embodiment, the substrate 48 has a dielectric constant responsive to temperature. For example, the substrate 48 can have a dielectric constant with a peak at a predetermined temperature, such as 100° C. As the anti-parallel LED structure 34 increases the temperature of the substrate 48 below the predetermined temperature, the dielectric constant of the substrate 48 increases, increasing the capacitance of the capacitor 32, increasing the current through the anti-parallel LED structure 34, and maintaining the light output of the anti-parallel LED structure 34. As the anti-parallel LED structure 34 increases the temperature of the substrate 48 above the predetermined temperature, the dielectric constant of the substrate 48 decreases, decreasing the capacitance of the capacitor 32, decreasing the current through the anti-parallel LED structure 34, and limiting temperature and preventing thermal runaway. The temperature coefficient can compensate for one or more anti-parallel LED structures with different operating characteristics than other anti-parallel LED structures mounted on the substrate, balancing the light output for all the anti-parallel LED structures.

Figure 3A:
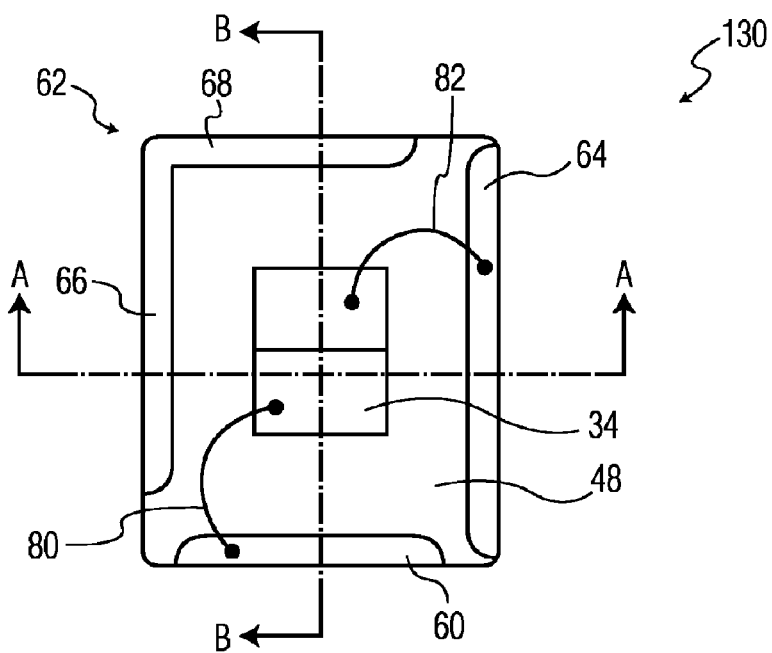
FIGS. 3A-3C are directional views of an LED assembly with capacitance plates made in accordance with the present invention.
Figure 3B:
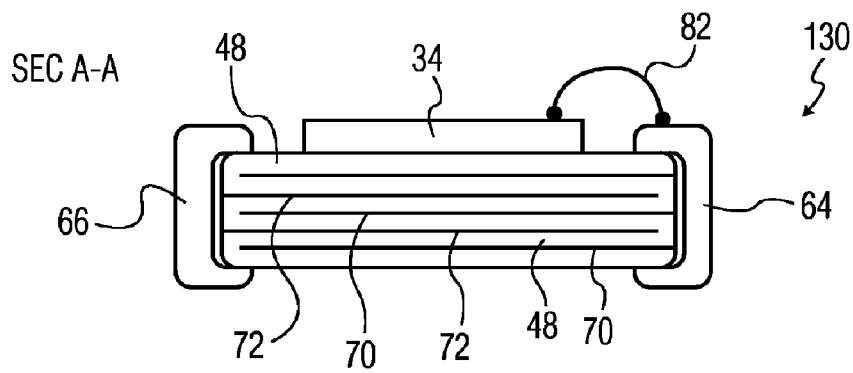
Figure 3C:
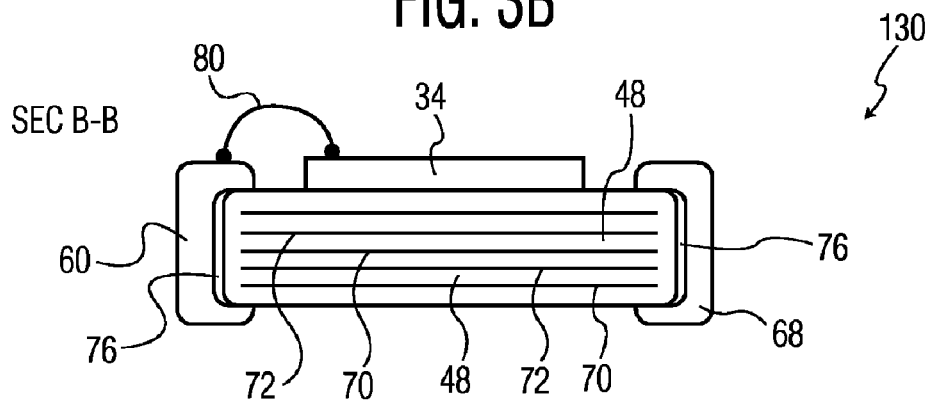

FIGS. 3A-3C are top, longitudinal cross section, and latitudinal cross section views, respectively, of an LED assembly with capacitance plates made in accordance with the present invention. The schematic diagram is the same as FIG. 1. In this embodiment, the first and second electrically-conductive plates of the capacitor are two groups of substantially parallel capacitive plates with the substrate disposed between them to increase the capacitance of the capacitor. Edge connectors can be used to make internal connections in the LED assembly, to make external connections with the LED assembly, and to assemble the LED assembly.

Referring to FIGS. 3A-3C, the LED assembly 130 includes a first edge connector 60 corresponding to the first connection 36 of FIG. 1, a second edge connector 62 corresponding to the first connection 36 of FIG. 1, and a third edge connector 64. The second edge connector 62 has a first connector portion 66 and a second connector portion 68. In another embodiment, the first connector portion 66 and the second connector portion 68 can be separate parts. The first edge connector 60 is electrically connected to the anti-parallel LED structure 34 by first connector 80 and the anti-parallel LED structure 34 is electrically connected to the third edge connector 64 by second connector 82.

The first and second electrically-conductive plates includes a number of first capacitive plates 70 and a number of second capacitive plates 72, respectively. The first capacitive plates 70 are interspersed with and arranged substantially parallel to the second capacitive plates 72. Adjacent capacitive plates alternate between first capacitive plates 70 and second capacitive plates 72 in an ABABA pattern. The substrate 48 is disposed between the first capacitive plates 70 and the second capacitive plates 72.

The first capacitive plates 70 are electrically connected to the third edge connector 64 and the second capacitive plates 72 are electrically connected to the first connector portion 66. The capacitive plates are shorter than the width of the LED assembly 130 so that the first capacitive plates 70 are not in contact with the first connector portion 66 and the second capacitive plates 72 are not in contact with the third edge connector 64. The capacitive plates are shorter than the length of the LED assembly 130 to avoid contact with the first edge connector 60 and the second connector portion 68, which are each insulated from the substrate 48 by insulation 76. The portion of the LED assembly 130 receiving the anti-parallel LED structure 34 can be an outermost capacitive plate or part of the substrate 48 as desired.

Figure 4:
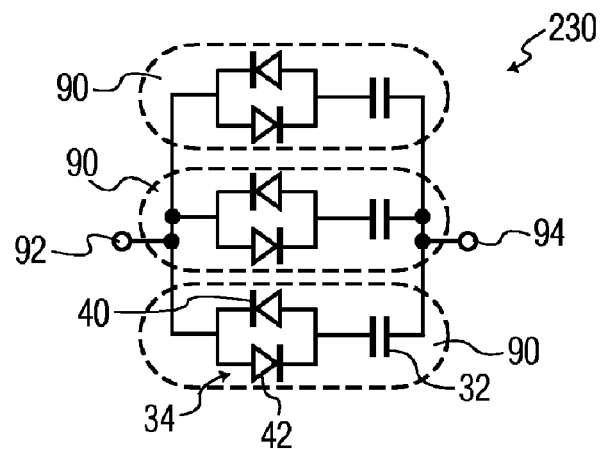
FIG. 4 is a schematic diagram of an LED assembly with selectable capacitance made in accordance with the present invention.
Figure 5A:
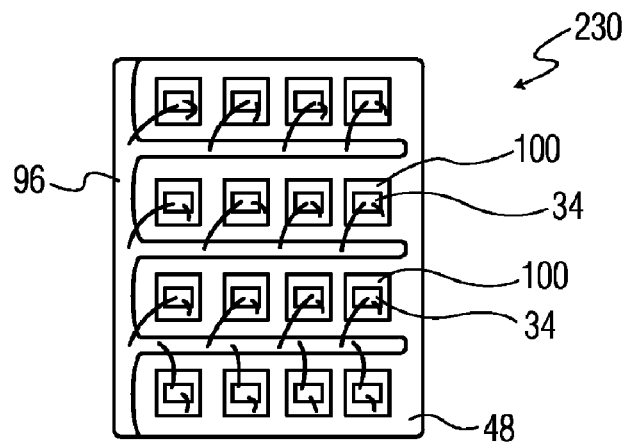
FIGS. 5A-5D are directional views of an LED assembly with selectable capacitance made in accordance with the present invention.
Figure 5B:
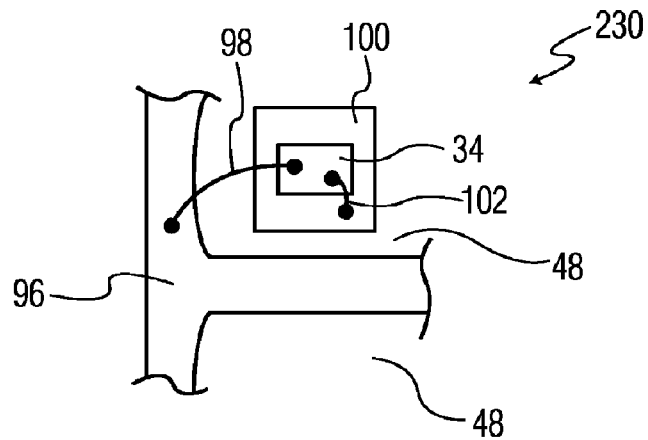
Figure 5C:
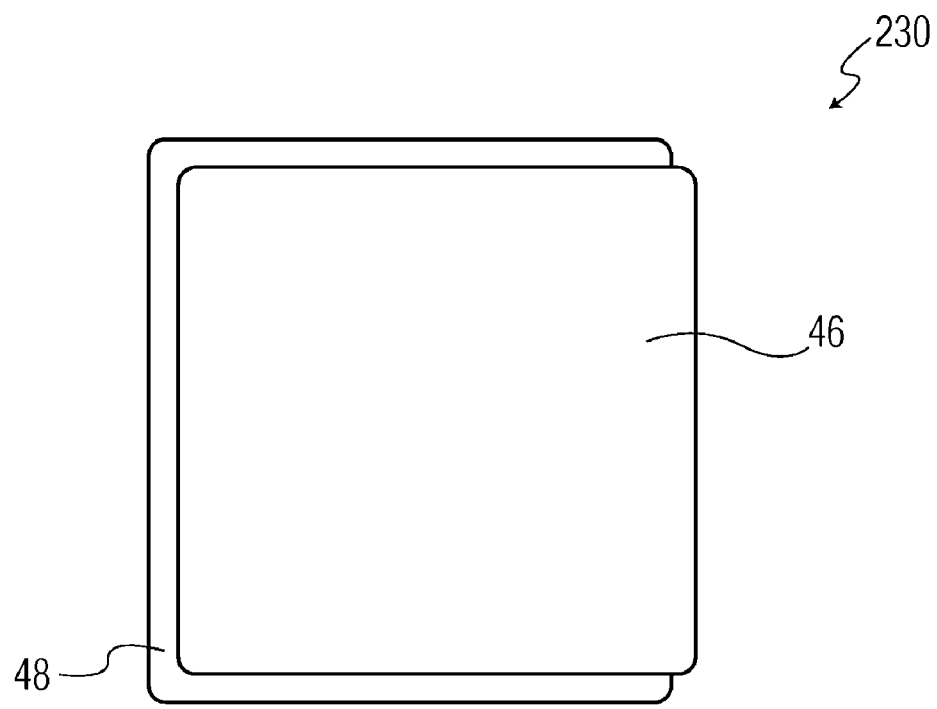
Figure 5D:
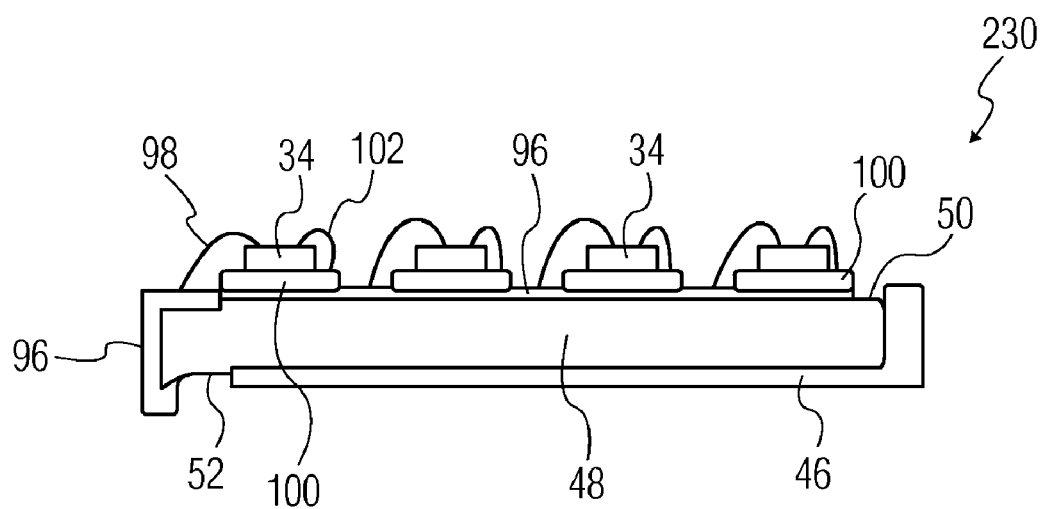

FIG. 4 is a schematic diagram of an LED assembly with selectable capacitance made in accordance with the present invention. The LED assembly 230 includes a number of LED circuits 90 corresponding to the LED assembly 30 of FIG. 1 connected in parallel between a first connection 92 and a second connection 94. Each of the LED circuits 90 includes a capacitor 32 and an anti-parallel LED structure 34 connected in series between the first connection 92 and the second connection 94. The anti-parallel LED structure 34 includes a first LED 40 and a second LED 42 connected in an anti-parallel manner, i.e., the first LED 40 and the second LED 42 are connected with opposite polarizations. The LED assembly 30 can be driven with an LED driver generating an alternating current as described in U.S. Pat. No. 6,853,150 incorporated herein by reference in its entirety.

FIGS. 5A-5D are top, top detail, bottom, and side views, respectively, of an LED assembly with selectable capacitance made in accordance with the present invention. In this embodiment, a number of anti-parallel LED structures are provided in the LED circuits to generate light. One electrically-conductive plate of each capacitor in each LED circuit is an electrically-conductive island. The area of each electrically-conductive island can be selected to provide the desired capacitance for the LED circuit and the associated anti-parallel LED structure.

The LED assembly 230 includes substrate 48 having a first side 50 opposing a second side 52. A common connector 96 and a number of electrically-conductive islands 100 are disposed on the first side 50. The area of each electrically-conductive island 100 can be selected to provide the desired capacitance for the LED circuit and the associated anti-parallel LED structure 34. This matching of the anti-parallel LED structure 34 and the capacitor 32 can compensate for operating characteristics of the anti-parallel LED structure 34. Different electrically-conductive islands can have different areas. Anti-parallel LED structures 34 are disposed on the electrically-conductive islands 100 and thermally coupled to the substrate 48. In another embodiment, the anti-parallel LED structures 34 are disposed directly on the substrate 48. First connectors 98 electrically connect the common connector 96 to each anti-parallel LED structure 34 and second connectors 102 electrically connect each anti-parallel LED structure 34 to each electrically-conductive island 100. Second electrically-conductive plate 46 is disposed on the second side 52 of the substrate 48. In one embodiment, the common connector 96 and/or the second electrically-conductive plate 46 wrap around an edge of the substrate 48. The common connector 96 and the second electrically-conductive plate 46 can wrap around opposing edges to separate external connections to the LED assembly 230. Those skilled in the art will appreciate that the second electrically-conductive plate 46 can be divided into second electrically-conductive islands on the second side 52 of the substrate 48 similar to the electrically-conductive islands 100, with each of the second electrically-conductive islands opposite one or more of the electrically-conductive islands 100 as desired for a particular circuit configuration.

Figure 6:
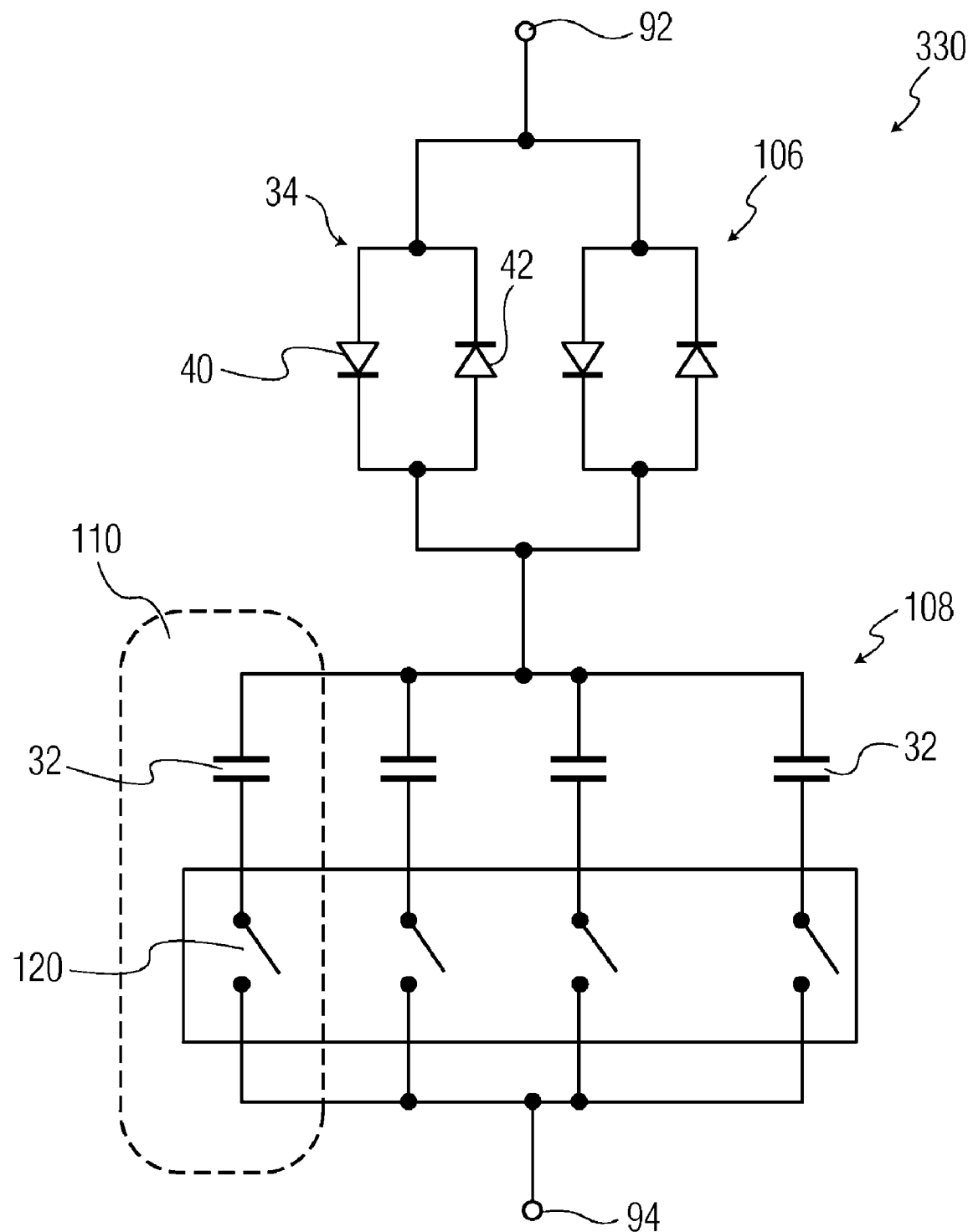
FIG. 6 is a schematic diagram of an LED assembly with switchable capacitance made in accordance with the present invention.
Figure 7A:
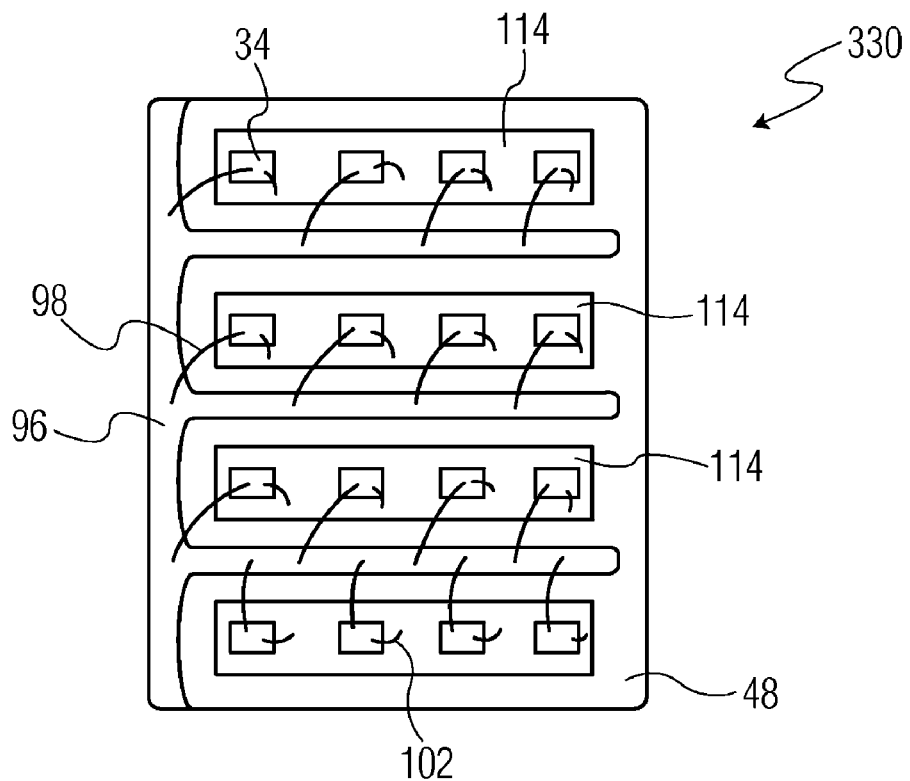
FIGS. 7A-7E are directional views of an LED assembly with switchable capacitance made in accordance with the present invention.
Figure 7B:
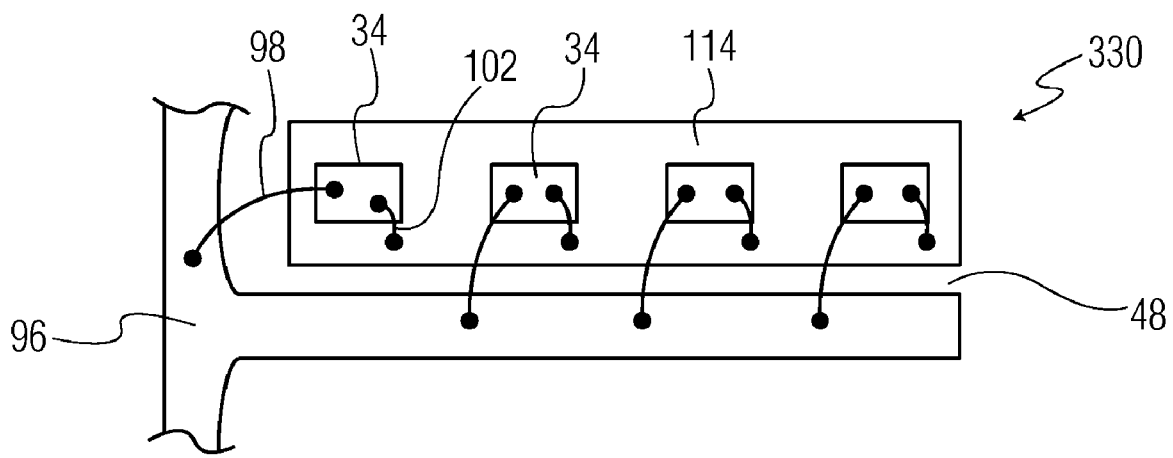
Figure 7C:
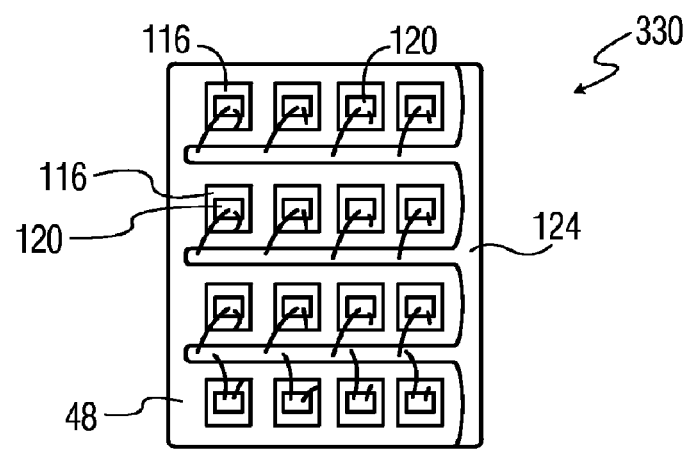
Figure 7D:
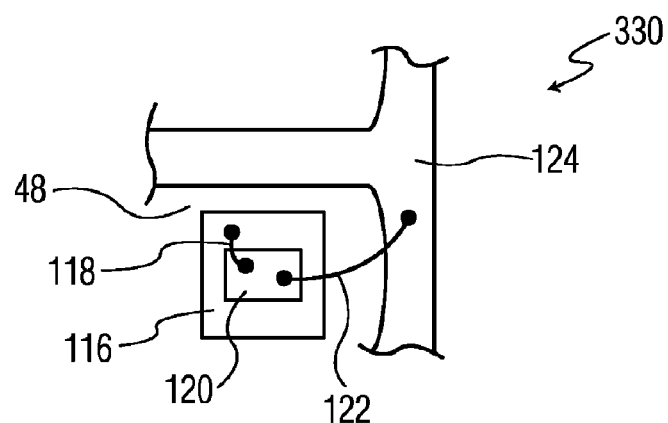
Figure 7E:
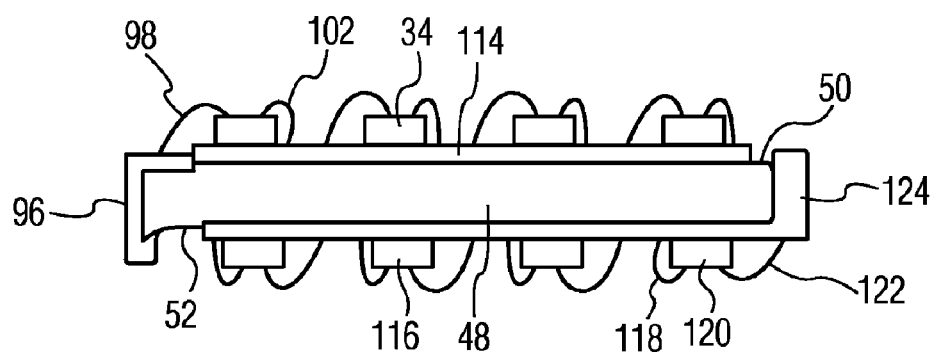

FIG. 6 is a schematic diagram of an LED assembly with switchable capacitance made in accordance with the present invention. The LED assembly 330 includes an LED array 106 electrically connected in series with a switchable capacitance array 108 between a first connection 92 and a second connection 94. The LED array 106 includes one or more anti-parallel LED structures 34 connected in parallel. The anti-parallel LED structure 34 includes a first LED 40 and a second LED 42 connected in an anti-parallel manner, i.e., the first LED 40 and the second LED 42 are connected with opposite polarizations. Those skilled in the art will appreciate that the anti-parallel LED structure 34 is not limited to a single pair of LEDs, but can include a number of LEDs connected in serial, parallel, and/or other array configurations as desired. The switchable capacitance array 108 includes one or more capacitance circuits 110 connected in parallel. Each capacitance circuit 110 includes a capacitor 32 and a switch 120 connected in series. The LED assembly 330 can be driven with an LED driver generating an alternating current as described in U.S. Pat. No. 6,853,150 incorporated herein by reference in its entirety.

FIGS. 7A-7E are top, top detail, bottom, bottom detail, and side views, respectively, of an LED assembly with switchable capacitance made in accordance with the present invention. In this embodiment, a number of anti-parallel LED structures are provided in series with switches providing switchable capacitance to control the current through the anti-parallel LED structures.

The LED assembly 330 includes substrate 48 having a first side 50 opposing a second side 52. A common connector 96 and a number of electrically-conductive plates 114 are disposed on the first side 50. Anti-parallel LED structures 34 are disposed on the electrically-conductive plates 114 and thermally coupled to the substrate 48. In another embodiment, the anti-parallel LED structures 34 are disposed directly on the substrate 48. First connectors 98 electrically connect the common connector 96 to each anti-parallel LED structure 34 and second connectors 102 electrically connect each anti-parallel LED structure 34 to the electrically-conductive plates 114. Electrically-conductive islands 116 are disposed on the second side 52 of the substrate 48. Switches 120 are disposed on the electrically-conductive islands 116. In another embodiment, the switches 120 are disposed directly on the substrate 48. Third connectors 118 electrically connect the electrically-conductive islands 116 to the switches 120 and fourth connectors 122 electrically connect the switches 120 to the common connector 124. In one embodiment, the common connector 96 and/or the common connector 124 wrap around an edge of the substrate 48. The common connector 96 and the common connector 124 can wrap around opposing edges to separate external connections to the LED assembly 330.

The switches 120 can be DIP switches, driven multiplexed switches, film resistance switches, or the like. In one embodiment, the switches 120 can be responsive to a switch control signal, such as a switch control signal from a controller, to switch the switchable capacitance and current through the anti-parallel LED structures 34 during operation. A number of the LED assemblies 330 can be connected in parallel with an LED driver to provide an adjustable output LED module.

Figure 8:
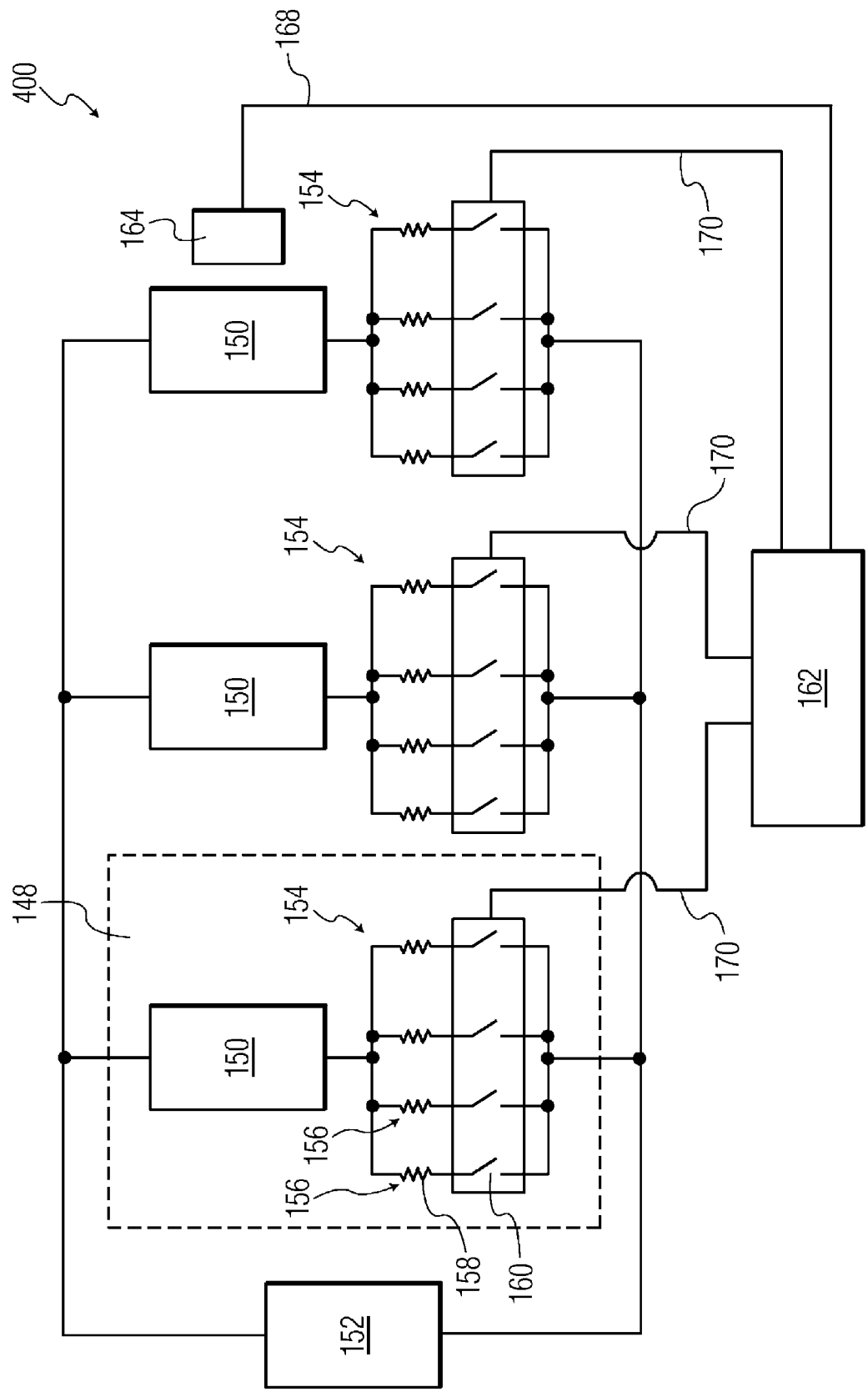
FIG. 8 is a schematic diagram of an adjustable output LED module made in accordance with the present invention.

FIG. 8 is a schematic diagram of an adjustable output LED module made in accordance with the present invention. Switchable impedance arrays in series with LED arrays control the current through the LED arrays. The current control can account for operating characteristic variations in the LEDs, compensate for light output changes with temperature, limit LED temperature, generate a desired light color and/or intensity, and the like.

The adjustable output light emitting diode (LED) module 400 includes an LED driver 152 and at least one LED assembly 148 electrically connected parallel to the LED driver 152. The LED assembly 148 has an LED array 150 with at least one LED structure and a switchable impedance array 154. The switchable impedance array 154 includes a plurality of impedance circuits 156 connected in parallel, each of the plurality of impedance circuits 156 including an impedance device 158 serially connected to a switch 160. When the LED driver 152 is an LED driver generating an alternating current, the LED structure is an anti-parallel LED structure and the impedance device 158 is a capacitor. When the LED driver 152 is an LED driver generating a direct current, the LED structure is a single polarity LED structure, i.e., a structure in which all LEDs are connected with the same polarizations, and the impedance device 158 is a resistor.

The switch 160 can be a manual or controlled switch, such as DIP switches, driven multiplexed switches, film resistance switches, or the like. Film resistance switches can be set during manufacture by laser trimming and can provide some or all of the impedance of the impedance device 158. In one embodiment, the switches 160 are responsive to a switch control signal 170 from an optional controller 162 operably connected to the switchable impedance array 154 to actuate the switches 160. The adjustable output LED module 400 can also include a temperature sensor 164 thermally connected to the LED array 150 to generate a temperature signal 168, with the controller 162 being responsive to the temperature signal 168. The controller 162 can use the temperature signal 168 to reduce current through the LED array 150 when the temperature signal exceeds a temperature limit and/or to maintain constant light output from the LED array 150 independent of the temperature of the LED array 150. The controller 162 can be a microprocessor and use a lookup table to determine the desired switch position for a particular temperature signal 168.

The impedance values of the switchable impedance arrays 154 can be selected to achieve particular effects. In one embodiment, each of the impedance device 158 in one of the switchable impedance arrays 154 have different impedance values than the impedance values of the other impedance devices 158 in the same switchable impedance array 154. In another embodiment, the pattern of impedance values for the impedance devices 158 in one of the switchable impedance arrays 154 is $1:2:4:8:\ldots 2^{(n-1)}$, where n is the number of the impedance devices 158 in the switchable impedance array 154. When there are four different impedance devices 158 in the switchable impedance array 154, sixteen different impedance values are possible with the different combinations of the switches 160.

The LED assemblies 148 can be selected so that each generates different color light, so that the combination of the different color lights at different intensities produces different perceived colors. For example, three LED assemblies 148 can be red, green, and blue light LED assemblies to form a RGB blended light source or four LED assemblies 148 can be red, green, blue, and yellow light LED assemblies to form a RGBY blended light source.

While the embodiments of the invention disclosed herein are presently considered to be preferred, various changes and modifications can be made without departing from the scope of the invention. The anti-parallel LED structures described are not limited to a single pair of LEDs, but can include a number of LEDs connected in serial, parallel, and/or other array configurations as desired. Those skilled in the art will appreciate that the embodiments described for FIGS. 1-8 are exemplary and that alternative circuits can be used as desired for particular applications. The scope of the invention is indicated in the appended claims, and all changes that come within the meaning and range of equivalents are intended to be embraced therein.

The invention claimed is:

1. A light emitting diode (LED) assembly comprising:
   a substrate having opposing first and second sides;
   a capacitor having first and second electrically-conductive plates respectively disposed proximate the first and second sides of the substrate; and
   an anti-parallel LED structure electrically connected to the first electrically-conductive plate and thermally coupled to the substrate,
   wherein the first electrically-conductive plate comprises a plurality of first capacitive plates;
   the second electrically-conductive plate comprises a plurality of second capacitive plates;
   the first capacitive plates are interspersed with and arranged substantially parallel to the second capacitive plates; and
   the substrate is disposed between the first capacitive plates and the second capacitive plates.

2. The assembly of claim 1, wherein the anti-parallel LED structure is disposed on a first capacitance plate.

3. The assembly of claim 1, wherein the substrate has a dielectric constant responsive to temperature.

4. The assembly of claim 1, wherein the substrate has a dielectric constant that peaks at a predetermined temperature.

5. The assembly of claim 1, wherein the anti-parallel LED structure and the capacitor are matched to compensate for operating characteristics of the anti-parallel LED structure.

6. The assembly of claim 1, wherein:
   the capacitor is a first capacitor;
   the first electrically-conductive plate is a first electrically-conductive island disposed proximate the first side of the substrate; and
   the anti-parallel LED structure is a first anti-parallel LED structure electrically connected to the first electrically-conductive island;
   further comprising:
   a second capacitor having a second electrically-conductive island disposed proximate the first side of the substrate and the second electrically-conductive plate disposed proximate the second side of the substrate;
   a second anti-parallel LED structure electrically connected to the second electrically-conductive island; and
   a common connector electrically connected to the first and the second anti-parallel LED structures respectively opposite the first and the second electrically-conductive islands.

7. The assembly of claim 6, wherein the first electrically-conductive island and the second electrically-conductive island have different areas.

8. The assembly of claim 1, wherein
   the capacitor is a first capacitor;
   the first electrically-conductive plate is a first electrically-conductive plate disposed proximate the first side of the substrate;
   the second electrically-conductive plate is a second electrically-conductive island opposite the first electrically-conductive plate; and
   the anti-parallel LED structure is a first anti-parallel LED structure electrically connected to the first electrically-conductive plate;
   further comprising:
   a first switch electrically connected to the second electrically-conductive island;
   a second capacitor having the first electrically-conductive plate disposed proximate the first side of the substrate and a third electrically-conductive island disposed opposite the first electrically-conductive plate proximate the second side of the substrate; and
   a second anti-parallel LED structure electrically connected to the first electrically-conductive plate; and
   a second switch electrically connected to the third electrically-conductive island.

9. The assembly of claim 8, further comprising a common connector electrically connected to the first and the second anti-parallel LED structures respectively opposite the first electrically-conductive plate.

10. The assembly of claim 8, further comprising a common connector electrically connected to the first and the second switches respectively opposite the second and the third electrically-conductive islands.

11. The assembly of claim 8, wherein the first switch is selected from the group consisting of a DIP switch, a driven multiplexed switch, and a film resistance switch.

12. The assembly of claim 8, wherein the first switch is responsive to a switch control signal.

13. An adjustable output light emitting diode (LED) module comprising:
    an LED driver; and
    at least one LED assembly electrically connected parallel to the LED driver, the LED assembly having an LED array and a switchable impedance array;
    wherein the LED array comprises at least one anti-parallel LED structure and the switchable impedance array comprises a plurality of impedance circuits connected in parallel, each of the plurality of impedance circuits comprising a capacitor serially connected to a switch,
    wherein the LED assembly further comprising:
    a substrate having opposing first and second sides;
    a first capacitor having a first electrically-conductive island disposed proximate the first side of the substrate and a second electrically-conductive plate disposed proximate the second side of the substrate;
    a first anti-parallel LED structure electrically connected to the first electrically-conductive island;
    a second capacitor having a second electrically-conductive island disposed proximate the first side of the substrate and the second electrically-conductive plate disposed proximate the second side of the substrate;
    a second anti-parallel LED structure electrically connected to the second electrically-conductive island; and
    a common connector electrically connected to the first and the second anti-parallel LED structures respectively opposite the first and the second electrically-conductive islands.

14. The module of claim 13, further comprising a controller operably connected to the switchable impedance array to actuate the switches in the plurality of impedance circuits.

15. The module of claim 14, further comprising a temperature sensor thermally connected to the LED array to generate a temperature signal, wherein the controller is responsive to the temperature signal.

16. The module of claim 15, wherein the controller is responsive to the temperature signal to reduce current through the LED array when the temperature signal exceeds a temperature limit.

17. The module of claim 15, wherein the controller is responsive to the temperature signal to maintain constant light output from the LED array.

18. The module of claim 13, wherein each of the capacitors in one of the switchable impedance arrays have different capacitances than the capacitances of the other capacitors in the one of the switchable impedance arrays.

19. The module of claim 13, wherein a pattern of capacitances for the capacitors in one of the switchable impedance arrays is $1:2:4:8: \ldots 2^{(n-1)}$, where n is the number of the capacitors in the one of the switchable impedance arrays.

20. The module of claim 13, wherein the at least one LED assembly comprises a plurality of LED assemblies, each of the plurality of LED assemblies generating light of a different color than the other of the plurality of LED assemblies.

21. An adjustable output light emitting diode (LED) module comprising:
   an LED driver;
   at least one LED assembly electrically connected parallel to the LED driver, the LED assembly having an LED array and a switchable impedance array, the LED array having at least one LED structure, the switchable impedance array having a plurality of impedance circuits connected in parallel, each of the plurality of impedance circuits comprising a resistor serially connected to a switch;
   a controller operably connected to the switchable impedance array to actuate the switches in the plurality of impedance circuits, the controller being responsive to the temperature signal; and
   a temperature sensor thermally connected to the LED array to generate a temperature signal,
   wherein the LED assembly further comprising:
   a substrate having opposing first and second sides;
   a first capacitor having a first electrically-conductive plate disposed proximate the first side of the substrate and a second electrically-conductive island disposed proximate the second side of the substrate;
   a first anti-parallel LED structure electrically connected to the first electrically-conductive plate;
   a first switch electrically connected to the second electrically-conductive island;
   a second capacitor having the first electrically-conductive plate disposed proximate the first side of the substrate and a third electrically-conductive island disposed opposite the first electrically-conductive plate proximate the second side of the substrate; and
   a second anti-parallel LED structure electrically connected to the first electrically-conductive plate; and
   a second switch electrically connected to the third electrically-conductive island.

22. The module of claim 21, wherein the controller is responsive to the temperature signal to reduce current through the LED array when the temperature signal exceeds a temperature limit.

23. The module of claim 21, wherein the controller is responsive to the temperature signal to maintain constant light output from the LED array.

24. The module of claim 21, wherein a pattern of resistance values for the resistors in one of the switchable impedance arrays is $1:2:4:8: \ldots 2^{(n-1)}$, where n is the number of the resistors in the one of the switchable impedance arrays.

25. The module of claim 21, wherein the at least one LED assembly comprises a plurality of LED assemblies, each of the plurality of LED assemblies generating light of a different color than the other of the plurality of LED assemblies.

* * * * *